(12) United States Patent
Sakamoto et al.

(10) Patent No.: US 8,118,933 B2
(45) Date of Patent: Feb. 21, 2012

(54) METHOD OF MANUFACTURING A SILICON CARBIDE SINGLE CRYSTAL

(75) Inventors: Hidemitsu Sakamoto, Susono (JP); Yukio Terashima, Mishima (JP)

(73) Assignee: Toyota Jidosha Kabushiki Kaisha, Toyota-shi, Aichi-ken (JP)

(*) Notice: Subject to any disclaimer, the term of this patent is extended or adjusted under 35 U.S.C. 154(b) by 679 days.

(21) Appl. No.: 12/296,145

(22) PCT Filed: Apr. 5, 2007

(86) PCT No.: PCT/IB2007/001003
§ 371 (c)(1), (2), (4) Date: Oct. 6, 2008

(87) PCT Pub. No.: WO2007/116315
PCT Pub. Date: Oct. 18, 2007

(65) Prior Publication Data
US 2009/0178610 A1     Jul. 16, 2009

(30) Foreign Application Priority Data
Apr. 7, 2006 (JP) .................. 2006-106145

(51) Int. Cl.
*C03B 15/02* (2006.01)
(52) U.S. Cl. ............... 117/81; 117/82; 117/83; 117/76; 117/78; 117/951
(58) Field of Classification Search ............ 501/81, 501/82, 83, 76, 78, 951; 117/81, 82, 83, 117/76, 78, 951
See application file for complete search history.

(56) References Cited

U.S. PATENT DOCUMENTS
6,428,621 B1 * 8/2002 Vodakov et al. ............. 117/108

FOREIGN PATENT DOCUMENTS
| JP | 2000-264790 | 9/2000 |
| JP | 2002-356397 | 12/2002 |
| JP | 2004-2173 | 1/2004 |
| JP | 2005-82435 | 3/2005 |
| JP | 2006-321681 | 11/2006 |

OTHER PUBLICATIONS

V. Pavlichenko et al., Abstract of "Investigation of Silicon Carbide Crystals and P-N Junctions Prepared by Growth from Solutions in Rare-Earth Elements," XP002447903, Database Accession No. 27550, from Fizika i Tekhnika Poluprovodnikov USSR, vol. 2, No. 11, pp. 1644-1650 (1968).
D. Hofmann et al., "Prospects of the Use of Liquid Phase Techniques for the Growth of Bulk Silicon Carbide Crystals," Materials Science and Engineering B61-62, pp. 29-39 (1999).

* cited by examiner

*Primary Examiner* — Karl Group
(74) *Attorney, Agent, or Firm* — Finnegan, Henderson, Farabow, Garrett & Dunner, LLP

(57) ABSTRACT

Silicon raw material is filled into a graphite crucible (10), the graphite crucible (10) is heated to form molten silicon (M), at least one rare earth element and at least one of Sn, Al, and Ge are added to molten silicon (M), and a temperature gradient is maintained in the molten silicon in which the temperature decreases from within the molten silicon toward the surface while growing an silicon carbide single crystal starting from an silicon carbide seed crystal (14) held immediately below the surface of the molten liquid.

4 Claims, 2 Drawing Sheets

FIG. 2

| | RARE EARTH ELEMENT (at%) | | SURFACE-ACTIVATION ELEMENT (at%) | | | GROWTH RATE (μm/h) | GROWTH SURFACE FLATNESS | JUDGMENT |
|---|---|---|---|---|---|---|---|---|
| | Dy | Ce | Sn | Al | Ge | | | |
| INVENTION | 30 | | 5 | | | 100 | ◎ | GOOD |
| | 30 | | 20 | | | 120 | ◎ | GOOD |
| | 5 | | 10 | | | 80 | ◎ | GOOD |
| | 30 | | 20 | | | 100 | ◎ | GOOD |
| | | 30 | 3 | | | 90 | ○ | GOOD |
| | 30 | | 25 | | | 110 | ○ | GOOD |
| | 3 | | 20 | | | 50 | ◎ | GOOD |
| | 40 | | 20 | | | 140 | ○ | GOOD |
| | 30 | | | 10 | | 110 | ◎ | GOOD |
| | 30 | | | 15 | | 100 | ◎ | GOOD |
| | 30 | | | | 15 | 90 | ◎ | GOOD |
| | 30 | | | | 20 | 90 | ◎ | GOOD |
| COMPARISON EXAMPLE | 5 | | | | | 80 | × | BAD |
| | 25 | | | | | 100 | × | BAD |
| | | 25 | | | | 80 | × | BAD |

METHOD OF MANUFACTURING A SILICON CARBIDE SINGLE CRYSTAL

CROSS-REFERENCE TO RELATED APPLICATIONS

This application is a national phase application of International Application No. PCT/IB2007/001003, filed Apr. 5, 2007, and claims the priority of Japanese Application No. 2006-106145, filed Apr. 7, 2006, the contents of both of which are incorporated herein by reference.

BACKGROUND OF THE INVENTION

1. Field of the Invention

The invention relates to a method for manufacturing a silicon carbide single crystal by the solution method.

2. Description of the Related Art

Because silicon carbide (SiC) has a larger energy band gap than silicon (Si), various types of manufacturing art have been proposed for manufacturing high-quality SiC single crystals suitable as semiconductor materials. While a diverse range of methods of manufacturing SiC single crystals have been tried, the sublimation method is the method in general use at present. Although the sublimation method features a high growth rate, it has the disadvantages of defects such as micropipes and disturbances of the crystal structure such as multiple crystal structures. In contrast, the solution method, although it has a relatively slow growth rate, is gaining attention because it does not have these disadvantages.

In the solution method, a temperature gradient is created in molten silicon in a graphite crucible, in which the temperature decreases from within toward the surface of the molten silicon. Carbon that is dissolved in the molten silicon rises from the high-temperature region near the bottom of the graphite crucible, due mainly to convection of the molten fluid, and becomes supersaturated when it reaches the low-temperature part in the vicinity of the surface of the molten silicon. An SiC seed crystal is held on the end of a graphite rod immediate below the surface of the molten liquid, the supersaturated carbon crystallizing as an SiC single crystal by epitaxial growth on the SiC seed crystal.

In the solution method, however, there are cases in which even a slight change in growth conditions, such as the carbon concentration in the molten liquid and the liquid temperature and the like at the crystal growth surface prevents uniform single crystal with a planar growth surface, and polycrystallization, in which a plurality of separate growth hills are generated, tends to occur.

In practical use, it is desirable to increase the growth rate as much as possible, and increasing the temperature gradient is an effective method to achieve this. However, when the temperature gradient is excessive, excessive solid carbon at numerous locations in contact with the molten solution simultaneously generates multiple crystal cores, each growing to form polycrystallization. Additionally, even if the temperature gradient is optimized, the growth conditions at the crystal growth surface constantly change with time. The cause of this is generation of polycrystals in the vicinity of the crystal growth surface and at the surface of the crystal seed holding rod or deformation of the graphite crucible caused by a carbon solid solution. This prevents maintenance of single crystal growth with a planar growth surface, resulting in polycrystallization.

In addition to controlling the temperature gradient, various proposals have been made as methods of increasing the single crystal growth rate. One of the basic parameters controlling the rate of growth of an SiC single crystal is the rate of supply of Si and C to the growth surface. Because of the presence of a large amount of Si as a solvent, the carbon concentration dissolved in the molten silicon is a rate-determining factor.

Japanese Patent Application Publication No. JP-A-2000-264790 describes the increase of the growth of an SiC single crystal by adding a transition metal into the molten silicon to increase the carbon solubility. Based on this art, Japanese Patent Application Publication No. JP-A-2002-356397 describes the addition to the molten silicon, in addition to the transition metal, a rare earth metal, and simultaneously supplying a hydrocarbon gas to the molten liquid to increase the carbon concentration in the molten silicon, resulting in high-speed growth of the SiC single crystal. That the addition of a rare earth metal increases the solubility of carbon in the molten silicon is known from Dieter H. Hoffmann, et al., "Prospects of the Use of Liquid Phase Techniques for the Growth of Bulk Silicon Carbide Crystals," *Material Science and Engineering*, B61-62 (1999), p. 29-39. Additionally, Japanese Patent Application Publication No. JP-A-2004-2173 describes art for achieving high-speed growth of SiC single crystals by the addition of Mn or Ti to the molten silicon.

However, while all of the above related art is directed at achieving high-speed growth, it does not address the issue of achieving a planar growth surface. Under growth conditions that achieve a high growth rate, because SiC single crystals tend to generate multiple cores or polycrystallization at multiple locations on the growth surface, maintenance of stable, planar growth over the entire period of crystal growth is difficult. To obtain a high-quality SiC single crystal suitable for practical use, it is thus essential to achieve both high growth rate and planar growth.

Upon experimenting using the method of manufacturing described in Japanese Patent Application Publication No. JP-A-2004-2173, maintenance of planar growth required that the growth rate be maintained at 50 µm/h or lower. Although the addition of Ti increases the amount of dissolved carbon, it was not possible to maintain planar growth using the growth rate noted in this reference.

In growing an SiC single crystal using the solution method, because of time variation of the atmosphere in the vicinity of the growth boundary, although a uniform planar growth layer is obtained at the beginning of growth, multi-core structure becomes prominent as the growth layer increases in thickness. The resulting roughness of the growth surface prevents the planar growth.

Although with an increase in the amount of dissolved carbon, growth is possible with even a small temperature gradient, the large amount of carbon promotes a multi-core structure, resulting in a roughened growth surface, preventing planar growth.

The foregoing described art for manufacturing a single crystal does not achieve both growth rate and planar growth at the same time.

SUMMARY OF THE INVENTION

The invention provides a method for manufacturing a silicon carbide (SiC) single crystal that increases the growth rate without increasing the temperature gradient, and simultaneously maintains a stable planar growth surface.

An aspect of the invention is a method for manufacturing an SiC single crystal that maintains a temperature gradient in which the temperature decreases from within the molten silicon toward the surface within a graphite crucible while growing an SiC single crystal starting from an SiC seed crystal held immediately below the surface of the molten liquid, and adds to the molten silicon at least one rare earth element and at least any one of Sn, Al, and Ge.

In the foregoing aspect of the invention, the addition to the molten silicon of at least (1) a rare earth element and (2) at least any one of Sn, Al, and Ge achieves the following effects (a) and (b).

(a) The effective additive rare earth element has the effect of increasing the solubility of carbon in the molten silicon, thereby enhancing the driving force acting on the SiC single crystal growth to increase the growth rate.

(b) The effective surface-activation additive element among Sn, Al, and Ge acts as a surface activant to uniformly activate the overall growth surface to maintain a stable planar growth surface. Specifically, because polycrystallization (multi-core structure) in which the growth surface is roughened, is caused by the positionally or temporally non-uniform occurrence of crystal cores at multiple locations on the growth surface, by activating the overall growth surface, it is possible to uniformly generate crystal cores over the overall surface, thereby obtaining an SiC single crystal with stable planar growth.

By combining the foregoing additives (1) and (2), it is possible to simultaneously achieve the effect (a) of improving the growth rate and the effect (b) of achieving planar growth.

The foregoing elements added to the molten silicon are added only to bring about the effects (a) and (b), and are not substantially introduced into the SiC single crystal. Upon actual analysis of the composition of the grown SiC single crystal, the additive elements are not detected, and even if the additive elements are included in the SiC single crystal, they are at minute levels below the detection threshold. However, of the above-noted additive elements, because aluminum is more easily introduced into the SiC single crystal than tin and germanium, the amount of additive may be controlled to a concentration that can be ignored as a semiconductor substrate dopant.

BRIEF DESCRIPTION OF THE DRAWINGS

The foregoing and/or further objects, features, and advantages of the invention will become more apparent from the following description of example embodiments with reference to the accompanying drawings, in which like numerals are used to represent like elements, and wherein:

FIG. 2 shows the flatness of the growth surface of and the growth rate of an SiC single crystal obtained by the method of manufacturing an SiC single crystal according to the embodiment of the invention and a comparison example.

DETAILED DESCRIPTION OF THE PREFERRED EMBODIMENTS

Figure 1:
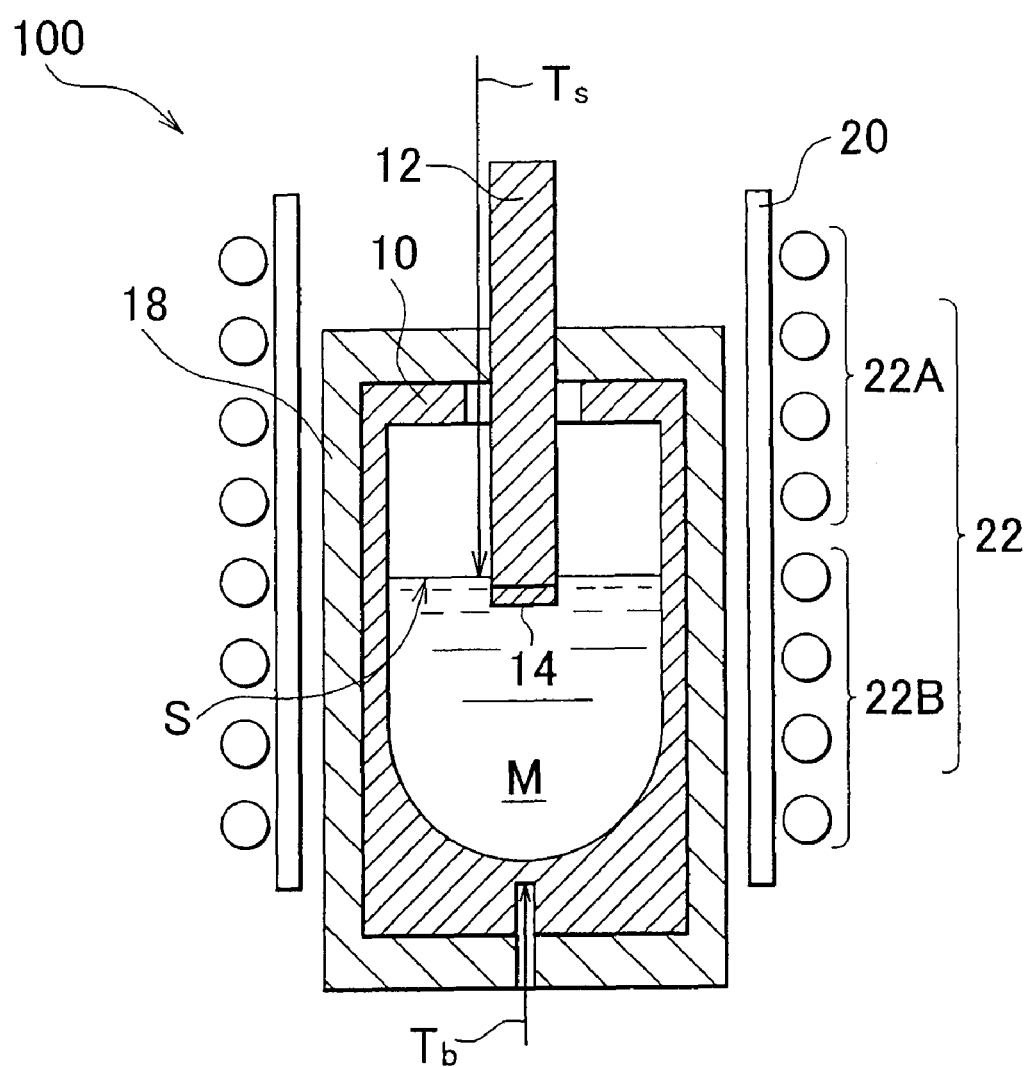
FIG. 1 is a cross-sectional view showing an example of the structure of an SiC single crystal fabrication furnace suitable for embodying the method for manufacturing an SiC single crystal according to an embodiment of the invention.

In the following description, the invention will be described in more detail in terms of example embodiments.

The SiC single crystal fabrication furnace 100 suitable for the embodiment of the method for manufacturing an SiC single crystal according to an embodiment of the invention shown in FIG. 1 is a furnace in which a temperature gradient is maintained within the molten silicon M inside a graphite crucible 10, wherein the temperature decreases from within the molten fluid toward the molten fluid surface S, and an SiC single crystal is grown starting from an SiC seed crystal 14 held by the graphite rod 12 immediately below the molten fluid surface S.

The thermal insulation material 18, entirely enclosed within the quartz pipe 20, surrounds the overall graphite crucible 10. The induction coil 22 is wound around the periphery of the quartz pipe 20. The upper coil 22A and the lower coil 22B forming the induction coil 22 may be independently controlled to form the required temperature gradient within the molten silicon M. The temperature Tb at the lower part of the crucible 10 and the temperature Ts at the surface of the molten fluid are measured using a pyrometer, and the output of the induction coil 22 is adjusted to control the temperature and temperature gradient of the molten silicon to the prescribed values, based on the measured temperatures.

A general SiC single crystal process using the SiC single crystal fabricating furnace 100 proceeds as follows.

The raw silicon material is first filled into the crucible 10 and the induction coil 22 is operated to form the molten silicon M.

The SiC seed crystal 14 is attached to the lower end of the graphite rod 12, which is inserted to a point immediately below the molten silicon surface S.

The output of the induction coil 22 is increased to raise the temperature of the molten fluid M. In doing this, the output of the upper coil 22A is set to approximately 30 to 50% of the output of the lower coil 22B, thereby raising the temperature while forming a temperature gradient in which the temperature decreases from the lower part of the molten silicon toward the upper part thereof. At the approximate point at which the temperature at the lower part of the molten fluid exceeds the melting point of silicon (approximately 1410° C.), carbon from the graphite crucible 10 begins to dissolve into the high-temperature molten silicon at the lower part.

The dissolved carbon is transported upward within the molten silicon by diffusion and convection, and attaches to the SiC seed crystal 14. The vicinity of the seed crystal 14 is maintained at a temperature lower than the lower part of the molten fluid by controlling the output of the upper and lower parts of coil 22 and by radiation of heat from the molten fluid surface S. When carbon dissolved into the high-temperature lower part of the molten fluid that has high solubility reaches the lower-temperature vicinity of the seed crystal at which the solubility is low, it goes into the supersaturated state, the degree of the supersaturation acting as a driving force to grow an SiC single crystal on the seed crystal.

In this embodiment, (1) at least one rare earth element and (2) at least one of Sn, Al, and Ge are added to the molten silicon. The additive (1) increases the carbon solubility in the molten silicon and increases the growth rate of the SiC single crystal, simultaneously with which the additive (2) activates the surface of the seed crystal and the growth surface of the crystal forming thereon, thereby causing uniform core formation and growth of a silicon crystal over the entire surface. The result is that polycrystallization is suppressed as the growth rate of the SiC single crystal is increased, enabling fabrication of an SiC single crystal having a planar growth surface.

The amount of the rare earth element additive may be made 5 at % to 30 at %. If the additive amount is less than 5 at %, there is no prominent increase in the carbon solubility, and small increase in the growth rate of the SiC single crystal. On the other hand, if the additive amount exceeds 30 at %, unless the temperature gradient is held to as small a gradient as possible, it is easy for multiple cores to form in the SiC crystal. Very fine temperature control is essential in preventing multi-core structure, making this method impractical.

Additionally, if the amount of rare earth element additive is excessive, when the molten silicon is removed from the furnace, carbides of the rare earth element generated in the molten fluid react with water in the air to generate acetylene gas, this being unsuitable from the standpoint of maintaining a safe working environment.

There is no particular restriction with regard to the rare earth element used in this embodiment. However, Dy and Ce appear to be more effective, although Y, Nd, Sm, Sc, La, Yb and the like, may still be used.

The amount of the additive of any one of Sn, Al, and Ge may be made 5 at % to 20 at %. If the additive amount is less than 5 at %, the surface-activation effect is weak, and if the additive amount exceeds 20 at % the surface-activation effect is excessively strong, and regardless of the element used, polycrystallization of the SiC tends to occur, and there is a tendency to destabilize planar growth. Detailed observation reveals that, when there is a deficiency of the surface-activation element, polycrystallization by the generation of many fine SiC grains tends to occur, in contrast to which if there is an excess of the surface-activation element there is a tendency for polycrystallization to occur by island growth of course SiC grains.

An equivalent planarizing effect may be achieved by the use of any one of Sn, Al, and Ge surface-activation elements. As already noted, it has been verified that the various elements are not introduced into the SiC single crystal at levels above the detection limit. However, even though these concentration levels are below current detection limits, if one considers the case in which these concentrations reach levels that should be considered as semiconductor dopant levels in the future, such as in semiconductor substrate applications, because n-type SiC single crystals are desirable as semiconductor substrates, Sn is the most desirable from the standpoint of an n-type dopant with respect to SiC, followed by Ge. Aluminum is a p-type dopant with respect to silicon. At present, because the effect of these elements as dopants can be ignored, it is possible to use the three elements as equivalent surface-activation elements.

An embodiment of the invention is described below. Using the SiC single crystal fabrication furnace 100 shown in FIG. 1, various amounts of either Dy or Ce as a rare earth element and one of Sn, Al, and Ge as a surface-activation element are added to molten silicon, and an SiC single crystal is grown using the above-noted usual fabrication sequence, with other conditions being the same. For the purpose of comparison, an SiC single crystal was grown with only the rare earth element (Dy or Ce) added to the molten silicon, under the same conditions.

FIG. 2 shows a summary of the combinations of additive elements, the obtained growth rates, and the obtained growth surface flatnesses. The amounts of additive of each element is referenced to the total amount of molten silicon and additive element (100 at %). A double circle in the growth surface flatness column indicates no polycrystallization of the SiC, a single circle indicates slight polycrystallization at the periphery, and "X" indicates total polycrystallization of the SiC.

As shown in FIG. 2, by using a compound additive, according to the invention, of either Dy or Ce as a rare earth element and any one of Sn, Al, and Ge as a boundary-activation element, it was possible to simultaneously achieve a high growth rate of 50 to 140 μm/h and a flat growth surface.

Particularly, if the amount of rare earth element additive is set to 5 to 30 at %, and the amount of surface-activation element additive is set to 5 to 20 at %, both a high level of growth rate and flatness are achieved, an SiC single crystal is grown at 80 to 120 μm/h.

If the amount of rare earth element Dy additive is 3 at %, although the flatness is good, the growth rate is slightly reduced to 50 μm/h. On the other hand, if the amount of rare earth element Dy additive is 40 at %, although the growth rate is 140 μm/h, slight polycrystallization occurs at the periphery.

With regard to the amount of surface-activation element added, slight polycrystallization occurs at the periphery when the Sn additive amount is 3 at %, and also when the Sn additive amount is 25 at %.

Because the comparison example had only a rare earth element (Dy or Ce) additive, although a high growth rate of 80 to 100 μm/h was achieved, with regard to flatness, the SiC was entirely polycrystallized.

Although not explicitly indicated in this embodiment, when adding only a surface-activation element (Sn, Al, and Ge), although planar growth is achieved, the growth rate is lower than the embodiment.

Thus, the achievement of both high speed and planar growth requires a compound additive of a rare earth element and a surface-activation element.

While the invention has been described with reference to example embodiments thereof, it should be understood that the invention is not limited to the described embodiments or constructions. To the contrary, the invention is intended to cover various modifications and equivalent arrangements. In addition, while the various elements of the example embodiments are shown in various combinations and configurations, other combinations and configurations, including more, fewer or only a single element, are also within the spirit and scope of the invention.

The invention claimed is:

1. A method for manufacturing a silicon carbide single crystal, comprising:
    filling a graphite crucible with silicon raw material;
    heating the graphite crucible to form molten silicon;
    adding to the molten silicon at least one rare earth element and one of Sn and Ge; and
    maintaining a temperature gradient in the molten silicon in which the temperature decreases from within the molten silicon toward the surface while growing a silicon carbide single crystal starting from a silicon carbide seed crystal held immediately below the surface of the molten liquid.

2. The method for manufacturing a silicon carbide single crystal according to claim 1, wherein the rare earth element is Dy or Ce.

3. The method for manufacturing a silicon carbide single crystal according to claim 1, wherein the rare earth element is at least one of Y, Nd, Sm, Sc, La, and Yb.

4. The method for manufacturing a silicon carbide single crystal according to claim 1, wherein
    the rare earth element is added to the overall molten silicon in an amount of 5 to 30 at %, and the one of Sn and Ge is added in an amount of 5 to 20 at %.

* * * * *